(12) United States Patent
Kwak et al.

(10) Patent No.: US 12,421,399 B2
(45) Date of Patent: Sep. 23, 2025

(54) METHOD OF MANUFACTURING ANTIFOULING COATING POLYMER USING INITIATED CHEMICAL VAPOR DEPOSITION

(71) Applicant: Industry-Academic Cooperation Foundation, Chosun University, Gwangju (KR)

(72) Inventors: Jae Bok Kwak, Gwangmyeong-si (KR); Chang Hoon Kim, Yeosu-si (KR); Jeong Heon Lee, Anyang-si (KR)

(73) Assignee: Industry-Academic Cooperation Foundation, Chosun University, Gwangju (KR)

( * ) Notice: Subject to any disclaimer, the term of this patent is extended or adjusted under 35 U.S.C. 154(b) by 216 days.

(21) Appl. No.: 18/050,951

(22) Filed: Oct. 28, 2022

(65) Prior Publication Data
US 2023/0140401 A1    May 4, 2023

(30) Foreign Application Priority Data
Oct. 29, 2021    (KR) .................. 10-2021-0146369

(51) Int. Cl.
| C09D 5/16 | (2006.01) |
| B05D 1/00 | (2006.01) |
| C09D 7/63 | (2018.01) |
| C09D 133/16 | (2006.01) |

(52) U.S. Cl.
CPC ............. C09D 5/1668 (2013.01); B05D 1/60 (2013.01); C09D 7/63 (2018.01); C09D 133/16 (2013.01)

(58) Field of Classification Search
CPC ................ C09D 5/1668; C09D 7/63
See application file for complete search history.

(56) References Cited

U.S. PATENT DOCUMENTS 11,079,518 B1 *  8/2021  Smyth .................... H10N 30/87

FOREIGN PATENT DOCUMENTS

| KR | 10-2013-0103392 A | | 9/2013 | | |
| KR | 20130103392 A | * | 9/2013 | ............. | H01L 21/20 |
| KR | 10-2017-0022691 A | | 3/2017 | | |
| KR | 10-2019-0084403 A | | 7/2019 | | |
| KR | 20200092691 A | * | 8/2020 | ............. | C12N 15/10 |
| KR | 102313857 B1 | * | 10/2021 | .......... | D06M 15/277 |

OTHER PUBLICATIONS

J. Seo et al., Facilitated embedding of silver nanowires into conformally-coated iCVD polymer films deposited on cloth for robust wearable electronics, Nanoscale, 2017, 9, 3399 DOI: 10.1039/C6NR08168A (Year: 2017).*

Machine translation of Im et al., KR20200092691A [online]. Espacenet [retrieved on Dec. 30, 2024]. Retrieved from the internet: <https://worldwide.espacenet.com/patent/>. (Year: 2020).*

\* cited by examiner

*Primary Examiner* — Genevieve S Alley
(74) *Attorney, Agent, or Firm* — Studebaker Brackett PLLC

(57) ABSTRACT

A method of manufacturing an antifouling coating layer is disclosed. The method includes depositing a fluorine-based monomer, a crosslinking agent, and an initiator on a substrate by putting them into an iCVD chamber. The fluorine-based monomer is one, or two or more selected from a group of C2FMA, C3FMA, C4FMA, C5FMA, C6FMA, C7FMA, and C8FMA. The antifouling coating layer has excellent antifouling characteristic and durability through quick deposition using iCVD.

2 Claims, 17 Drawing Sheets

(a)

(b)

(a)

(b)

(a)

(b)

(a)

(b)

METHOD OF MANUFACTURING ANTIFOULING COATING POLYMER USING INITIATED CHEMICAL VAPOR DEPOSITION

CROSS-REFERENCE TO RELATED APPLICATIONS

This application claims the priority of Korean Patent Application No. 10-2021-0146369 filed on Oct. 29, 2021, in the Korean Intellectual Property Office, the disclosure of which is incorporated herein by reference.

BACKGROUND OF THE INVENTION

Field of the Invention

The present disclosure relates to an antifouling coating layer and, in more detail, a method of manufacturing an antifouling coating layer using iCVD.

Description of the Related Art

An antifouling characteristic is very important for sensors, lenses, or windows in an autonomous vehicle system. Technologies of implementing an antifouling surface are very various, and particularly, a superhydrophobic surface is representative of antifouling surfaces.

It attracts attention that having a superhydrophobic surface characteristic means having an antifouling effect against contaminants. A superhydrophobic surface can be formed using the principle that water flows down.

In order to form a superhydrophobic surface, there are a method of forming a nano structure and a method of forming a polymer thin film using a chemical characteristic. iCVD, which is a chemical vapor deposition process that deposit a thin film on a desired base material by generating a chemical reaction using an initiator and a monomer, is a process of forming a polymer organic thin film using a reaction between an initiator, which is vaporized by applying heat to a monomer and the initiator in a canister and is then radicalized by a filament, and the monomer positioned on a base material by the temperature difference between a substrate and the filament.

SUMMARY OF THE INVENTION

An objective of the present disclosure is to provide an antifouling coating layer, in detail, a method of manufacturing an antifouling coating layer having excellent antifouling characteristic and durability through quick deposition using iCVD.

In order to achieve the objectives, a method of manufacturing an antifouling coating layer according to an embodiment of the present disclosure include depositing a fluorine-based monomer, a crosslinking agent, and an initiator on a substrate by putting them into an iCVD chamber, wherein the fluorine-based monomer is one, or two or more selected from a group of C2FMA, C3FMA, C4FMA, C5FMA, C6FMA, C7FMA, and C8FMA.

A flow rate ratio of the fluorine-based monomer, the crosslinking agent, and the initiator that are put into an iCVD chamber may be fluorine-based monomer:crosslinking agent:initiator=2:0.7~1.5:1.

The crosslinking agent may be DVB (divinylbenzene) or GMA (glycidyl methacrylate).

The initiator may be TBPO (tert-butyl peroxide).

The fluorine-based monomer may have been heated at 60 to 90° C.

The crosslinking agent may have been heated at 30 to 45° C.

A flow rate of the fluorine-based monomer may be 8.4 to 10.4 sccm, a flow rate of the crosslinking agent may be 3.5 to 8 sccm, and a flow rate of the initiator may be 4.6 to 5.4 sccm.

The method of manufacturing an antifouling coating layer of the present disclosure has an effect that it can form a coating layer through quick deposition and has an excellent antifouling characteristic and excellent durability.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Figure 1:
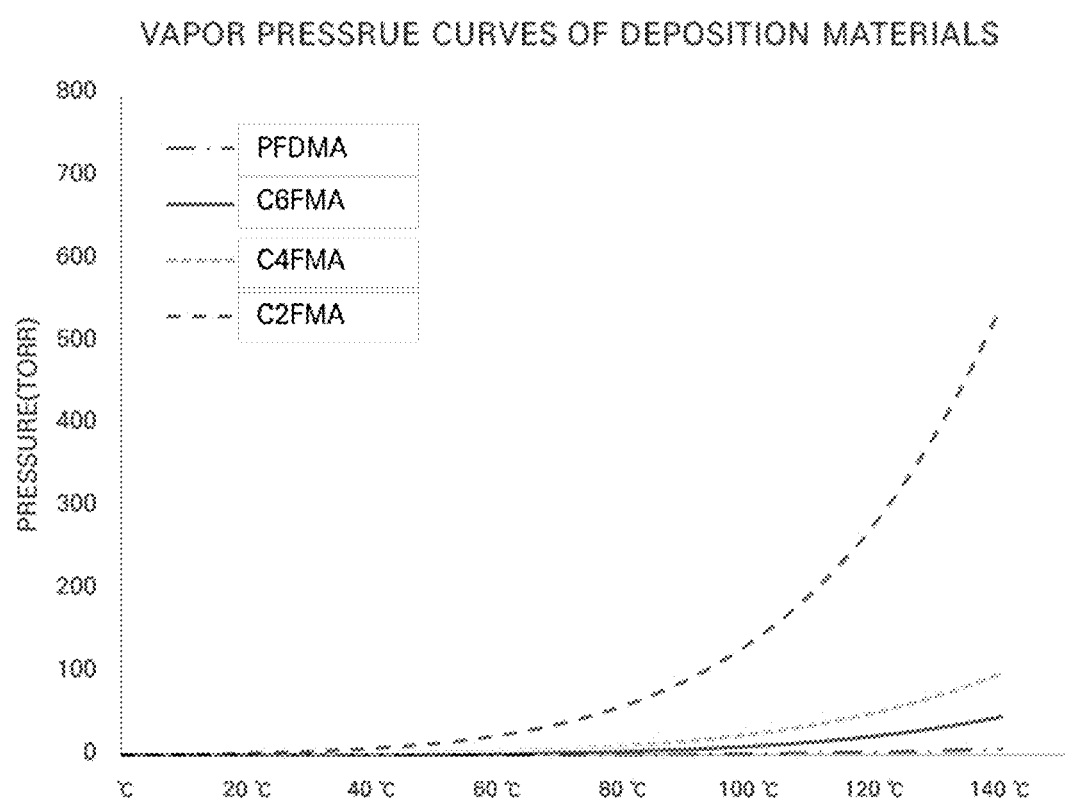
FIG. 1 is a view showing vapor pressure curves of materials according to an embodiment of the present disclosure.

Hereafter, embodiments of the present invention will be described in detail so that those skilled in the art can easily achieve the present disclosure. However, the present disclosure may be modified in various different ways and is not limited to the embodiments described herein.

A method of manufacturing an antifouling coating layer according to an embodiment of the present disclosure may include depositing a fluorine-based monomer, a crosslinking agent, and an initiator on a substrate by putting them into an iCVD chamber.

The fluorine-based monomer, the crosslinking agent, and the initiator may be supply substances that are put into an iCVD chamber.

The flow rate ratio of the fluorine-based monomer, the crosslinking agent, and the initiator that are put into an iCVD chamber may be fluorine-based monomer:crosslinking agent:initiator=2:0.7~1.5:1.

The fluorine-based monomer may be one or, two or more selected from a group of C2FMA (2-methyl tridecafluorooctyl ester), C3FMA (3-tridecafluorooctyl methacrylate), C4FMA (4-tridecafluorooctyl methacrylate; $C_4F_9C_2H_4OCOC(CH_3)=CH_2$), C5FMA (5-tridecafluorooctyl methacrylate), C6FMA (6-tridecafluorooctyl methacrylate or 2-(perfluorohexyl)ethyl methacrylate; $C_6F_{13}C_2H_4OCOC(CH_3)=CH_2$), C7FMA (7-tridecafluorooctyl methacrylate) and C8FMA (8-tridecafluorooctyl methacrylate; $C_8F_{17}C_2H_4OCOC(CH_3)=CH_2$).

The fluorine-based monomer may have been heated at 60 to 90° C.

The flow rate of the fluorine-based monomer may be 8.4 to 10.4 sccm.

The supply pressure of the fluorine-based monomer may be 1200 to 1500 mTorr.

The crosslinking agent may be DVB (divinylbenzene) or GMA (glycidyl methacrylate).

The crosslinking agent may have been heated at 30 to 45° C.

The flow rate of the crosslinking agent may be 3.8 to 8 sccm, and preferably, may be 6.2 to 8 sccm.

The supply pressure of the crosslinking agent may be may be 900 to 1200 mTorr.

The initiator may be TBPO (tert-butyl peroxide).

The initiator may have been heated at 40° C.

The flow rate of the initiator may be 4.6 to 5.4 sccm.

The supply pressure of the initiator may be may be 660 to 780 mTorr.

The temperature of pipes for putting the fluorine-based monomer, the crosslinking agent, and the initiator into the iCVD chamber may be 75 to 100° C.

The temperature of the wall of the iCVD chamber may be 75 to 100° C.

The ratio $P_M/P_{sat}$ of the partial pressure $P_M$ of each of the supply substance (a fluorine-based monomer, a crosslinking agent, and an initiator) that are supplied into the iCVD chamber and the saturation vapor pressure $P_{sat}$ of the supply substances on the substrate may be 0 to 1, and in this case, the ratio $P_M/P_{sat}$ of the partial pressure $P_M$ and the saturation vapor pressure $P_{sat}$ is not 0 or 1.

The substrate may be a glass substrate, a silicon substrate, an ITO (Indium Tin Oxide) transparent electrode, or a silver nano wire (AgNW) transparent, and the temperature of the substrate may be 10 to 50° C.

Hereafter, the present disclosure is described in more detail through embodiments. The present disclosure is only an embodiment for understanding the present disclosure and does not the range of the present disclosure.

Embodiment 1. Manufacturing of Antifouling Coating Layer

C6FMA ($C_6F_{13}C_2H_4OCOC(CH_3)=CH_2$), DVB (divinylbenzene), and TBPO (tert-butyl peroxide) are prepared as a monomer, a crosslinking agent, and an initiator, respectively, and a glass substrate (silicon substrate) is prepared as a substrate for deposition.

An antifouling coating layer is manufactured through an iCVD (initiated Chemical Vapor Deposition) process by the following method.

First, the C6FMA is heated at a temperature of 70° C. (C6FMA canister temperature), the DVB is heated at a temperature of 35° C. (DVB canister temperature), and the TPBO is heated at a temperature of 40° C. (TPBO canister temperature) through a canister. Further, the temperature of the pipe for supplying monomers (C6FMA, DVB, TPBO) into an iCVD chamber was set as 100° C., the pressure of the chamber was set as 500 mTorr, the temperature of the chamber wall was set as 100° C., the temperature of the silicon (Si wafer) substrate was set as 40° C., and the temperature of a filament was set as 180° C.

Thereafter, the flow rate of the C6FMA is set as 10 sccm, the flow rate of the DVD is set as 3.5 sccm, and the flow rate of the TPBO is set as 5 sccm (C6FMA:DVB:TPBO=2:0.7:1); the pressure of the C6FMA is set as 1400 mTorr, the pressure of the DVB is set as 1050 mTorr, and the pressure of the TBPO is set as 700 mTorr, whereby an antifouling coating layer having a thickness of 780 nm is manufactured on the silicon (Si wafer) substrate through deposition for 1 hour (hr).

Embodiment 2. Manufacturing of Antifouling Coating Layer

This is performed in the same way as the embodiment 1, in which the flow rate of the C6FMA is set as 10 sccm, the flow rate of the DVB is set as 7.5 sccm, and the flow rate of the TPBO is set as 5 sccm (C6FMA:DVB:TPBO=2:1.5:1).

Comparative Example 1. Manufacturing of PFDMA-TPBO Antifouling Coating Layer

PFDMA (1H, 1H, 2H, 2H-perfluorodecyl acrylate and TBPO (tert-butyl peroxide) are prepared as a monomer and an initiator, respectively, and a glass substrate (silicon substrate) is prepared as a substrate for deposition.

An antifouling coating layer is manufactured through an iCVD (initiated Chemical Vapor Deposition) process by the following method.

First, the PFDMA is heated at a temperature of 75° C. (PFDMA canister temperature) and the TPBO is heated at a temperature of 40° C. (TPBO canister temperature). Further, the temperature of the pipe for supplying monomers (PFDMA, TPBO) into an iCVD chamber was set as 100° C., the pressure of the chamber was set as 60 mTorr, the temperature of the chamber wall was set as 100° C., the temperature of the silicon (Si wafer) substrate was set as 40° C., and the temperature of a filament was set as 180° C.

Thereafter, the flow rate of the PFDMA is set as 3.8 sccm and the temperature of the TPBO is set as 3.8 sccm (PFDMA:TPBO=1:1); and the pressure of the PFDMA is set as 333 mTorr and the pressure of the TBPO is set as 183 mTorr, whereby an antifouling coating layer having a thickness of 780 nm is manufactured on the silicon (Si wafer) substrate through deposition for 1 hour (hr).

Experiment Example 1. Vapor Pressure Curves of Deposition Materials

A vapor pressure curve was analyzed for each of C6FMA', 'C4FMA', 'C2FMA', and 'PFDMA' that are the monomers used in the embodiments 1 and 2, and the analysis results were shown in FIG. 1.

Referring to FIG. 1, PFDMA that was used in an iCVD process in the related art shows high pressure at high temperature, but 'C6FMA', 'C4FMA', and 'C2FMA' cannot obtain high pressure even at low temperature, and the higher the pressure, the larger the input amount, so a higher deposition (coating) speed can be expected.

Experiment Example 1. FT-IR Analysis

Figure 2:
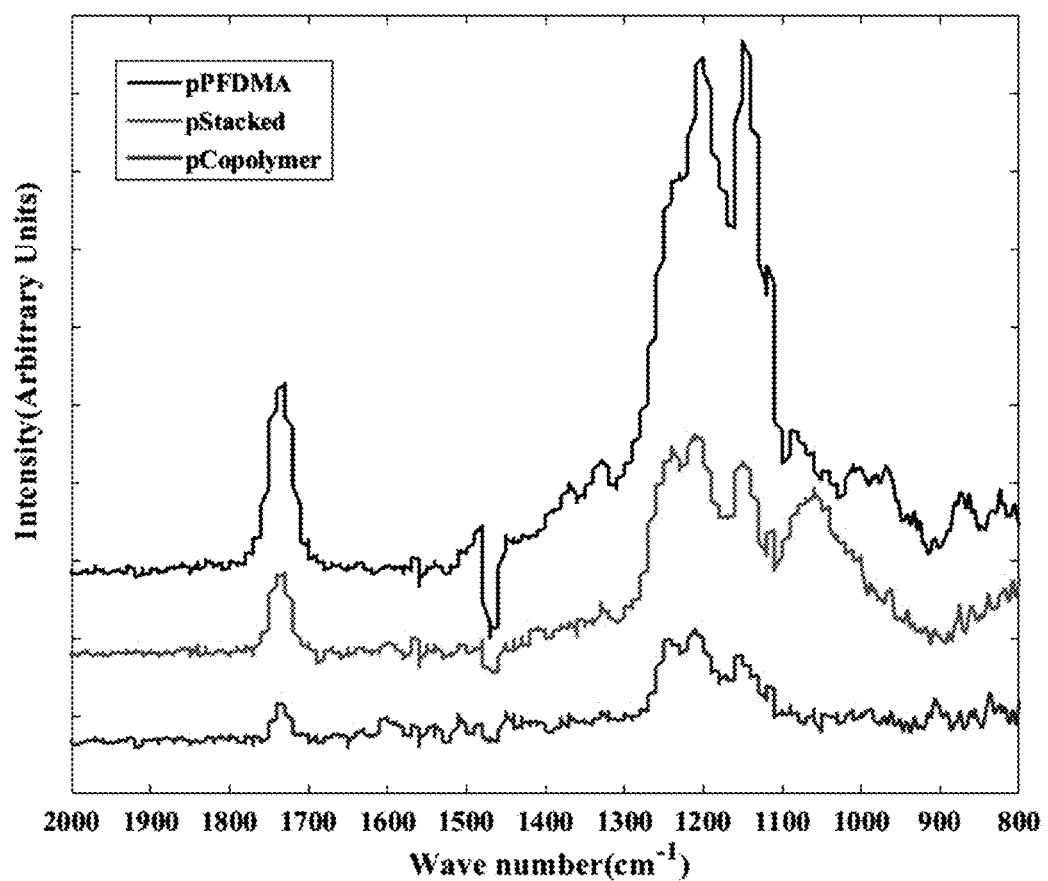
FIG. 2 is a view showing an FT-IR analysis result of an antifouling coating layer according to an embodiment of the present disclosure.

The result of performing FT-IR analysis on the antifouling coating layer manufactured in accordance with the embodiment 2 was shown in FIG. 2. Referring to FIG. 2, FR-IR analysis results of 'pPFDMA' composed of only PFDMA and 'pStacked' composed of PFDMA and V4D4 (1,3,5,7-tetravinyl-1,3,5,7-tetramethylcyclotetrasiloxane) as comparative groups were also shown, and the antifouling coating layer manufactured in accordance with the embodiment 2 was expressed as 'pCopolymer'.

Referring to FIG. 2, it is possible to know existence of C—F ($1150$~$1200$ $cm^{-1}$) and existence of DVB ($800$~$900$ $cm^{-1}$) that is a crosslinking agent.

Experiment Example 3. Contact Angle Analysis

Figure 3:
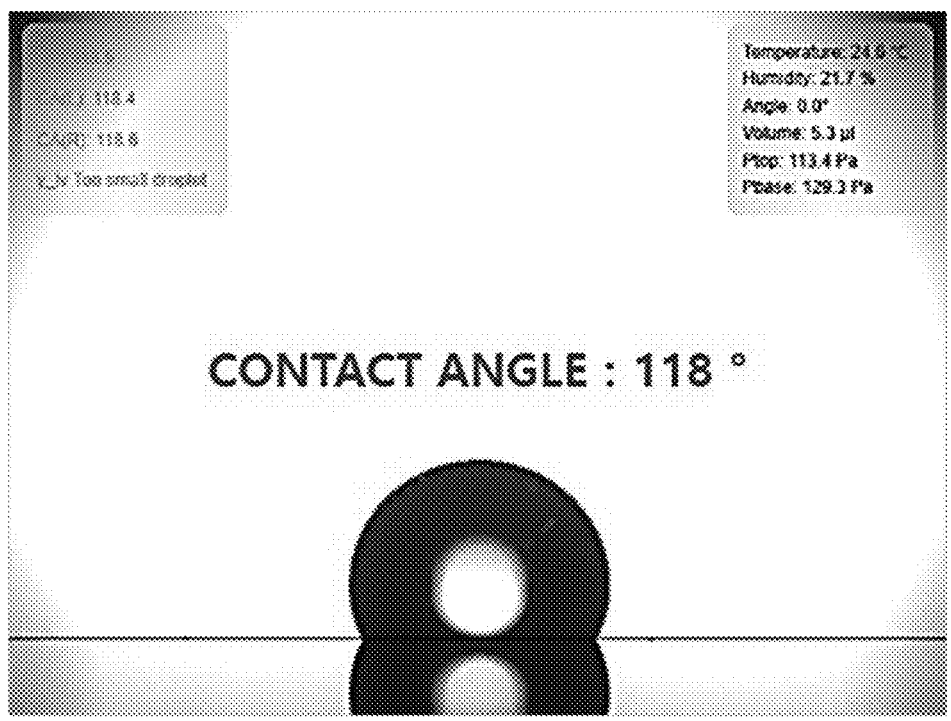
FIG. 3 is a view showing a contact angle analysis image of an antifouling coating layer according to an embodiment of the present disclosure.

Contact angles of the antifouling coating layers manufactured in accordance with the embodiments 1 and 2 were analyzed by a contact angle measurer (PHOENIXP-30) and the analysis images were shown in FIG. 3 ((a) of FIG. 3: embodiment 1 and (b) of FIG. 3: embodiment s).

The contact angle of the antifouling coating layer according to the embodiment 1 is 118° according to the embodiment 1 and the contact angle of the antifouling coating layer according to the embodiment 2 is 117°. Meanwhile, the contact angle of the PFDMA-TPBO antifouling coating layer according to the comparative example 1 is 142.1°.

Experiment Example 4. Wear Resistance Analysis

Figure 4:
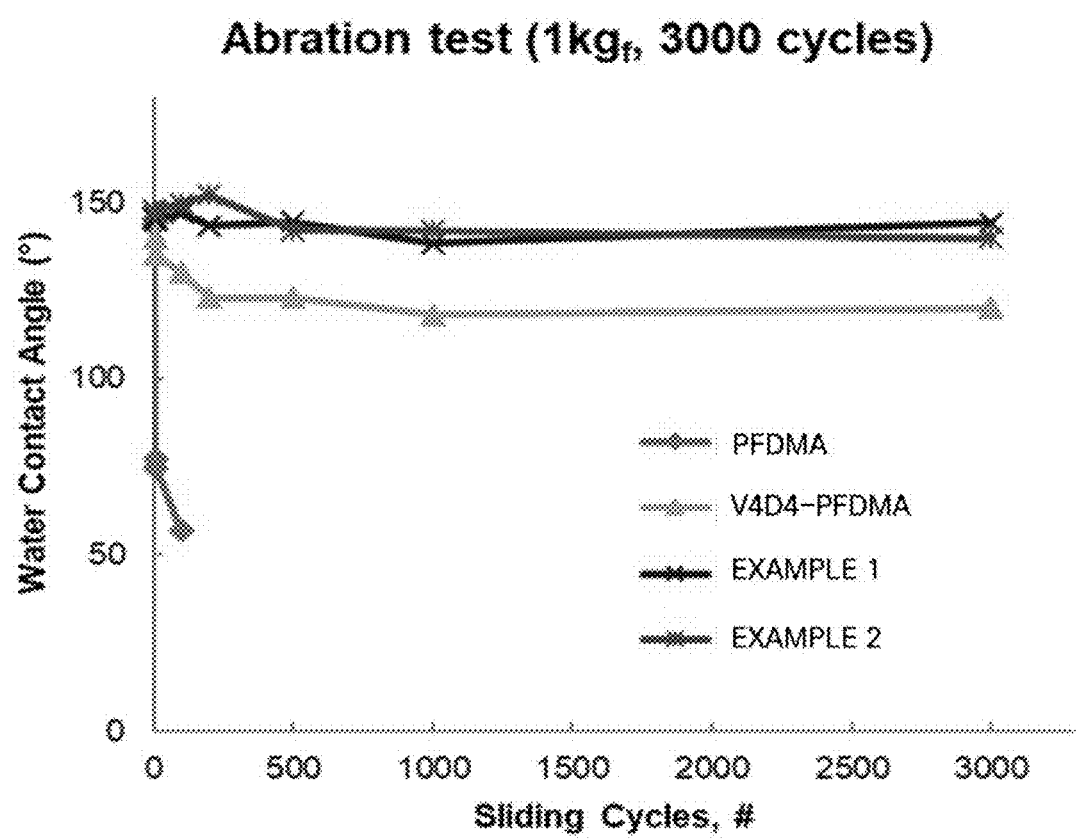
FIG. 4 is a view showing a contact angle analysis result according to wear resistance analysis of an antifouling coating layer according to an embodiment of the present disclosure.

Contact angle analysis according to sliding cycles (1 kgf, 3000 cycle) were performed on the antifouling coating layer manufactured in accordance with the embodiments 1 and 2, and 'pPFDMA' composed of only PFDMA and 'V4D4-PFDMA' composed of PFDMA and V4D4 (1,3,5,7-tetravinyl-1,3,5,7-tetramethylcyclotetrasiloxane) as comparative groups through an electronic rubbing tester, and the analysis results were shown in FIG. 4.

Referring to FIG. 4, it can be seen that the contact angle of the 'PFDMA' rapidly decreases as a cycle continues, and it is also can be seen that the contact angle of the 'V4D4-PFDMA' also slightly decreases. However, it can be seen that the contact angles of the antifouling coating layers according to the embodiments 1 and 2 does not decrease.

Experiment Example 5. Nano-Cutting Test

A wear test was performed using a wiper tip and shear strength of the coating layers were measured through a nano-cutting test to evaluate durability of the antifouling coating layers according to the embodiments 1 and 2.

Figure 5:
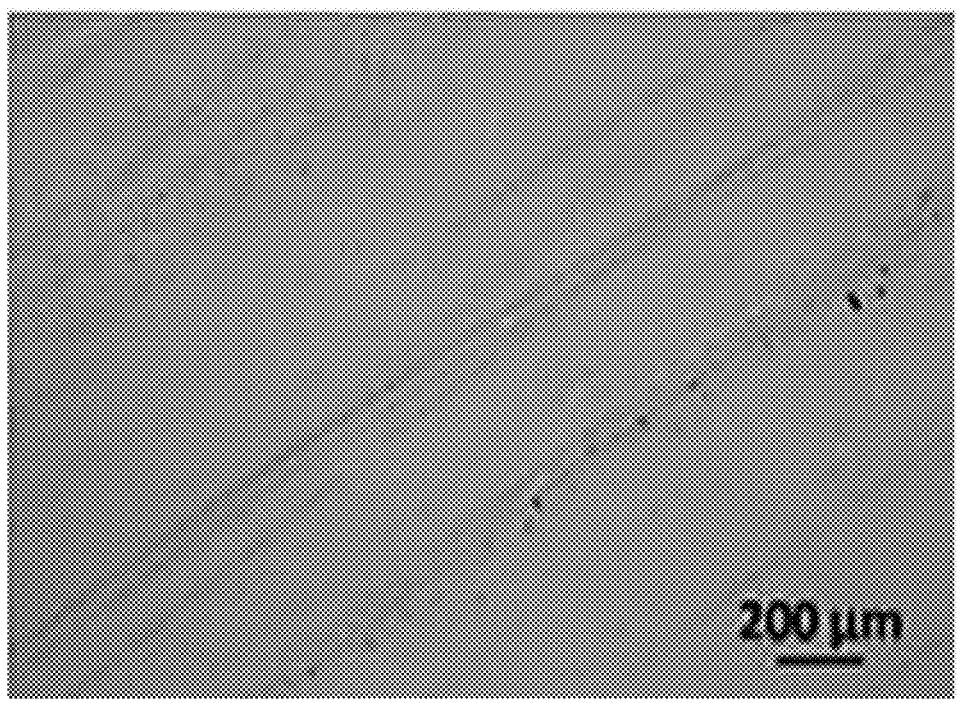
FIG. 5 is a view showing an analysis image according to a nano-cutting test of an antifouling coating layer according to an embodiment of the present disclosure.
Figure 5:
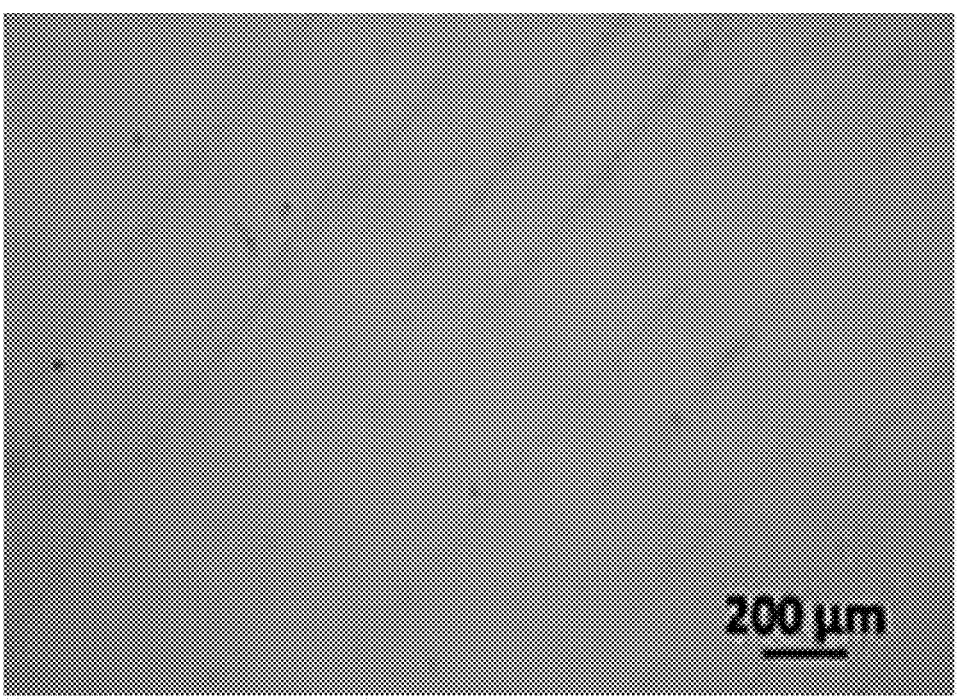

Surface images of wear test results of 100 cycles for 'C6FMA' composed of only a C6FMA monomer and the antifouling coating layer according to the embodiment 2 that are comparative groups were shown in FIG. 5, in which, as comparative groups, (a) of FIG. 5 is a surface image of the wear test result of 100 cycles for 'C6FMA' and (b) of FIG. 5 is a surface image of the wear test result of 100 cycles for the antifouling coating layer according to the embodiment 2.

Figure 6A:
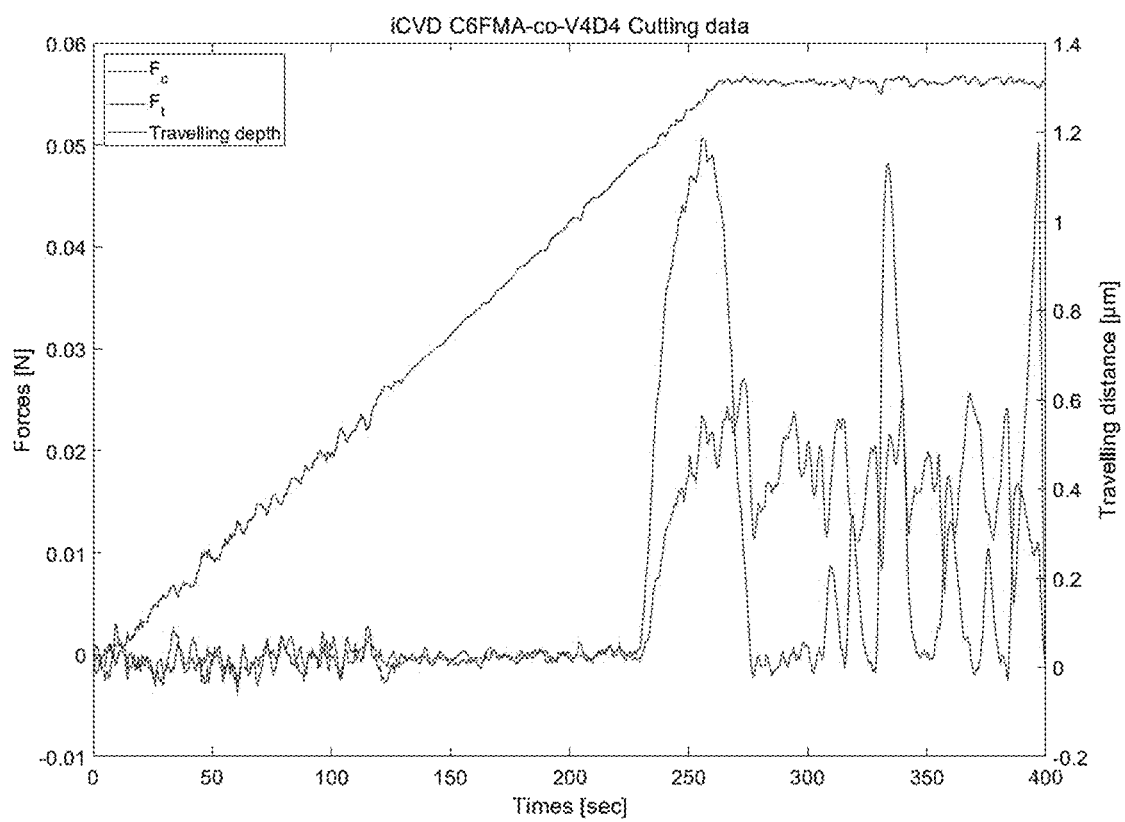
FIGS. 6A to 6D are views showing mechanical strength analysis results according to nano-cutting tests of an antifouling coating layer according to an embodiment of the present disclosure.
Figure 6B:
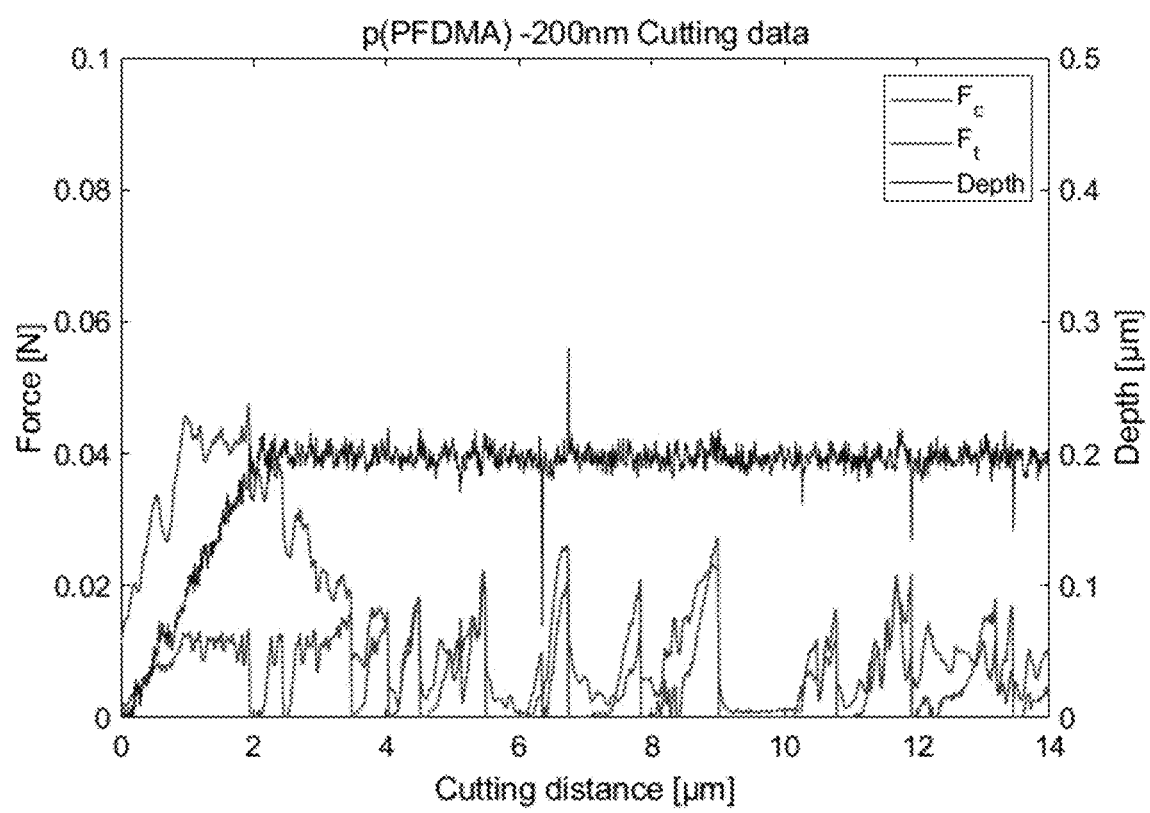
Figure 6C:
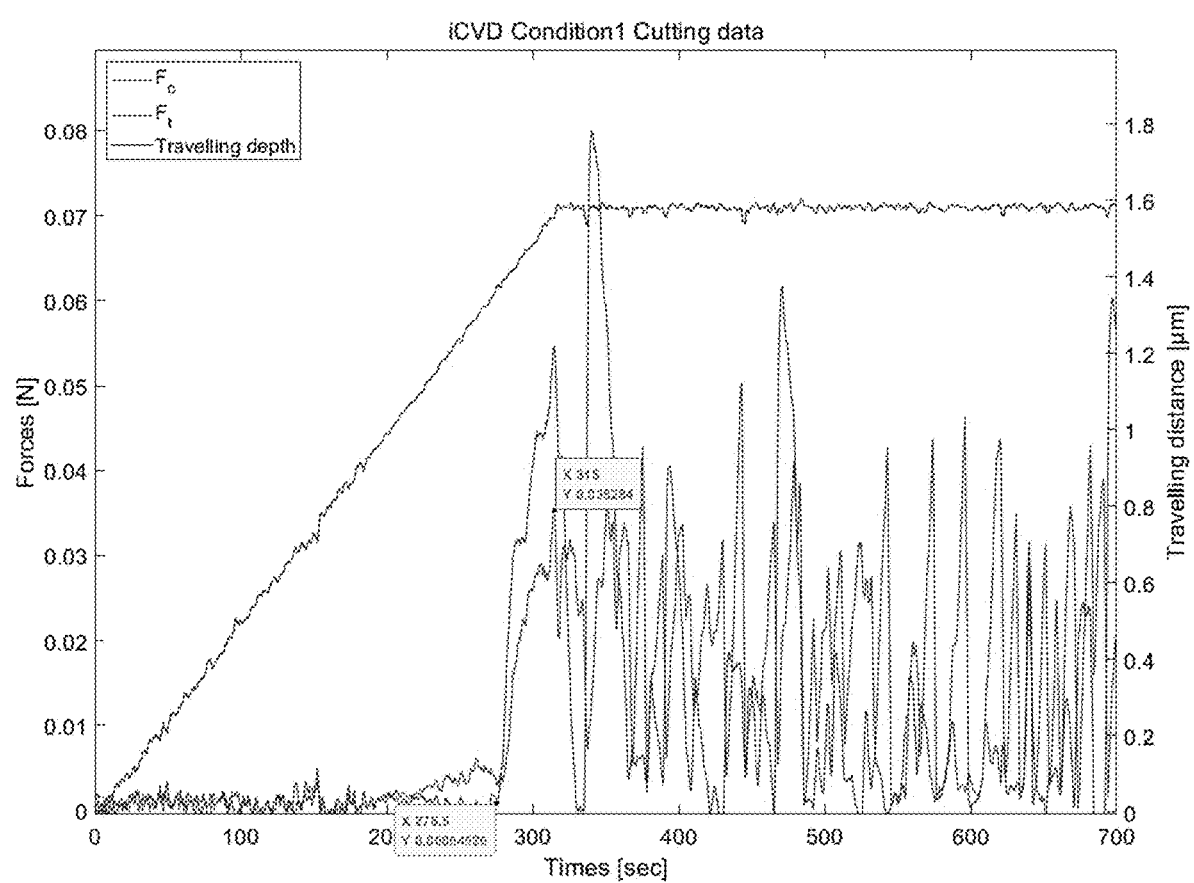
Figure 6D:
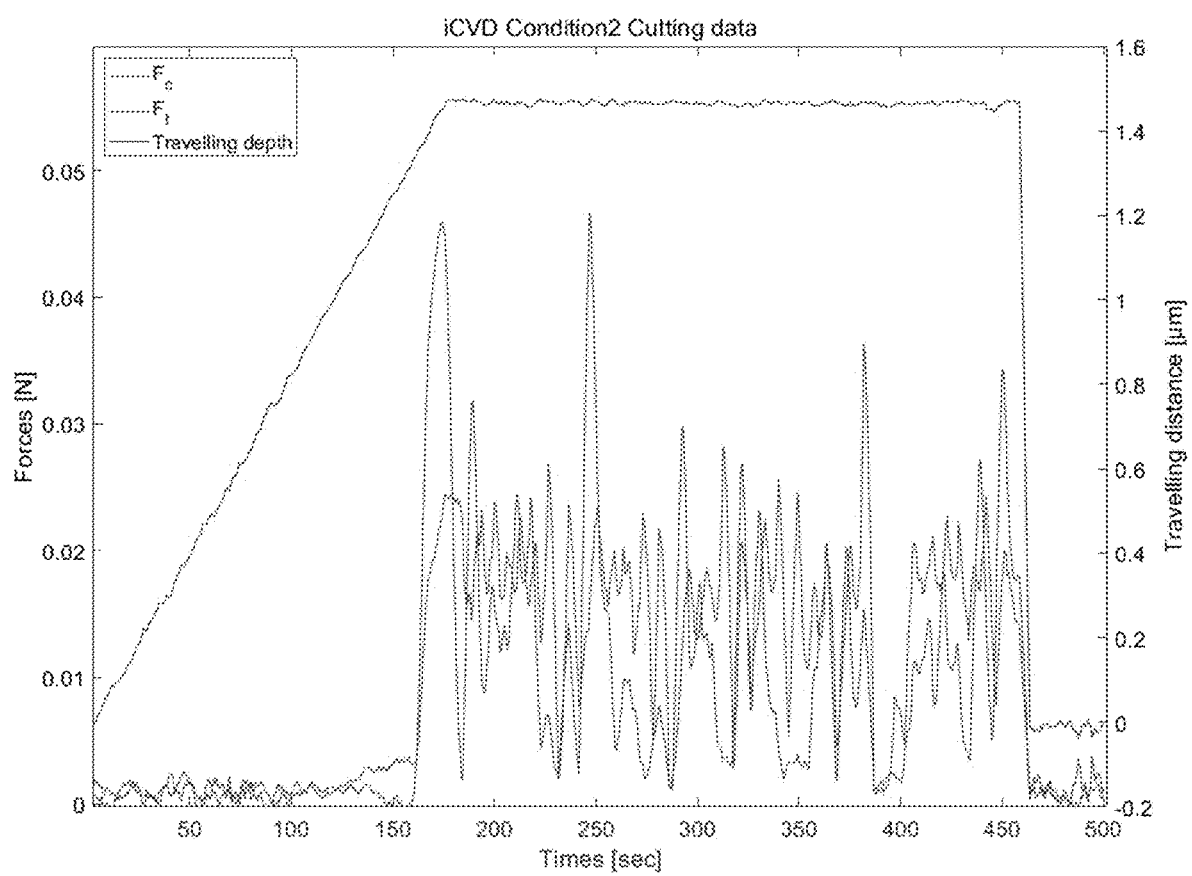
Figure 7A:
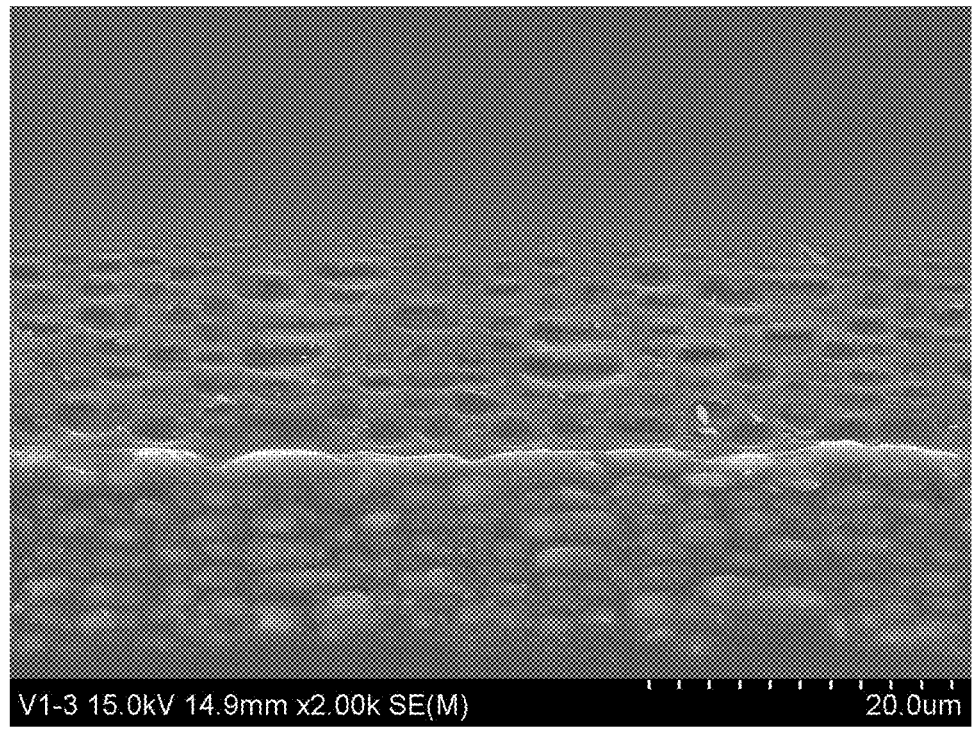
FIGS. 7A to 7D are views showing SEM images according to nano-cutting tests of an antifouling coating layer according to an embodiment of the present disclosure.
Figure 7B:
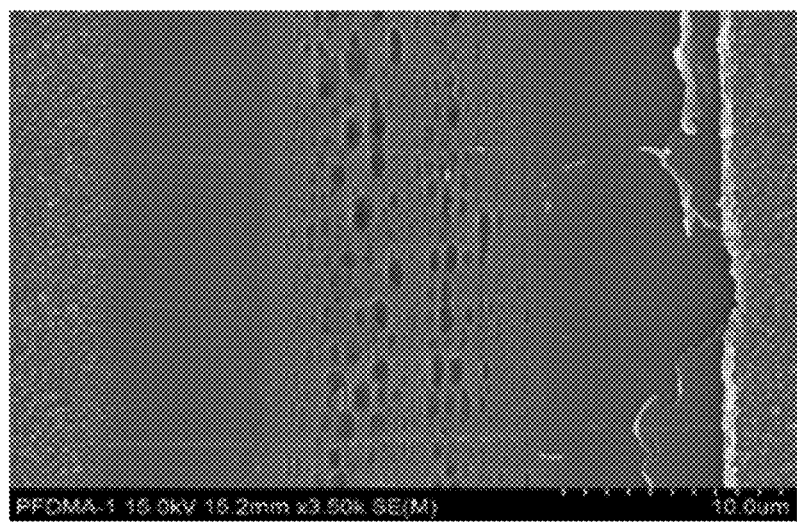
Figure 7B:
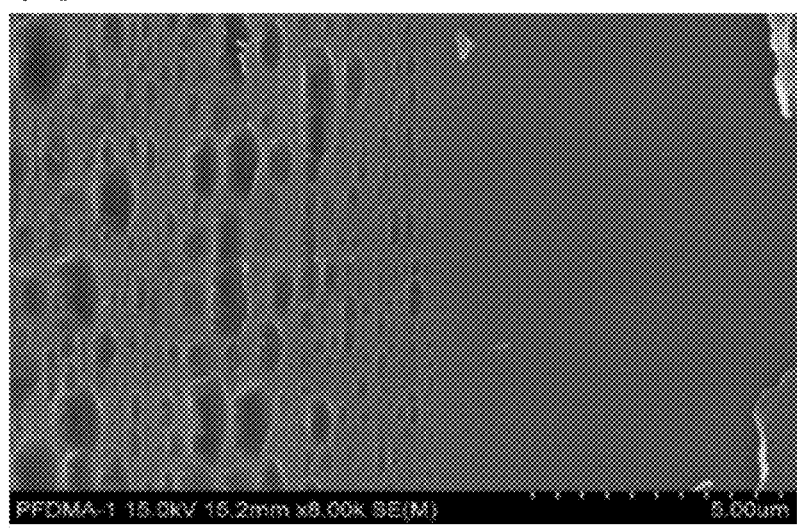
Figure 7C:
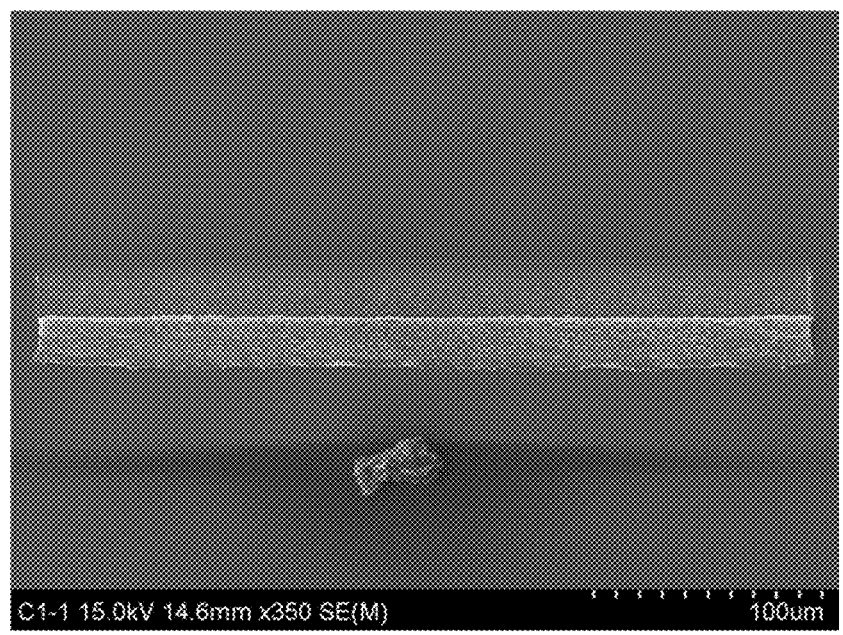
Figure 7C:
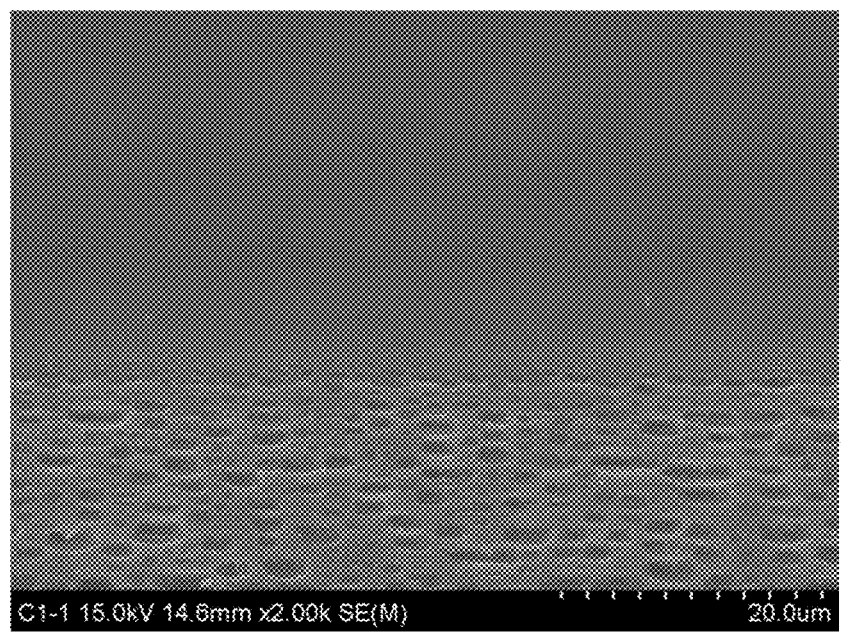
Figure 7D:
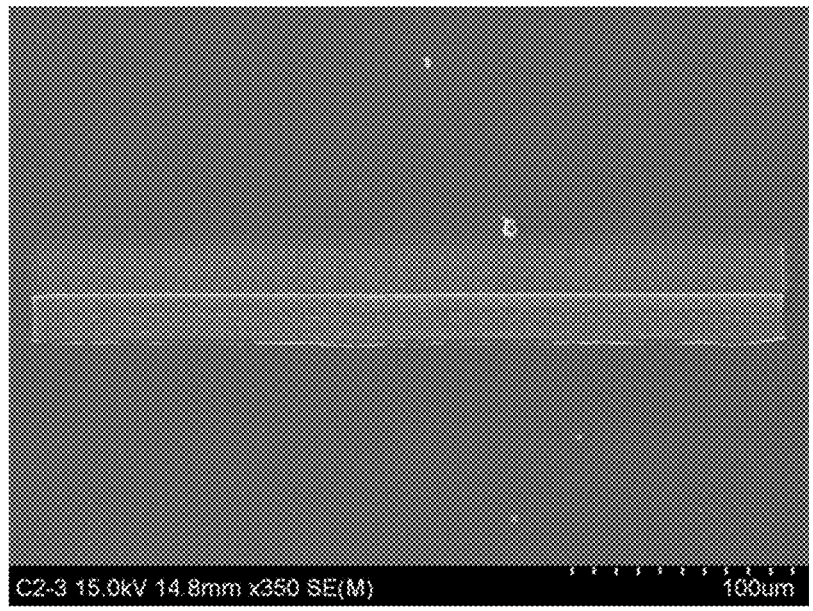
Figure 7D:
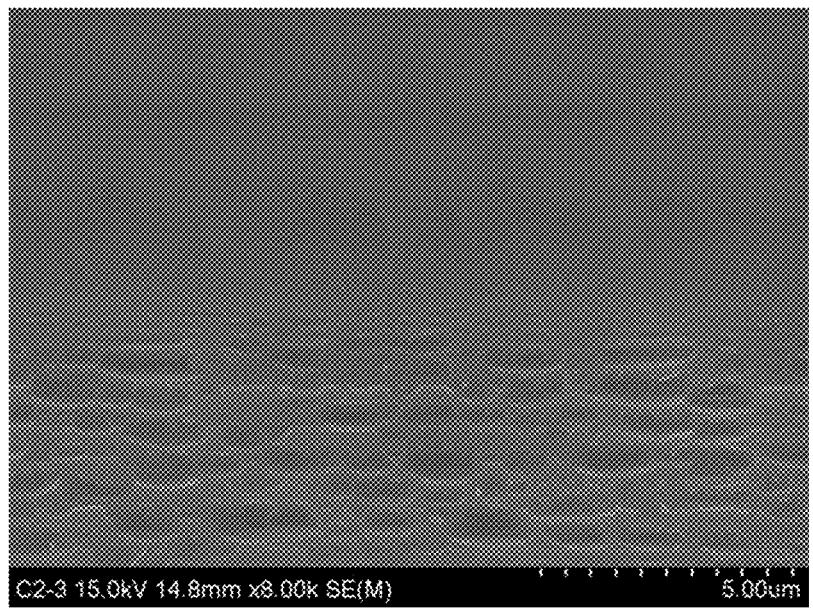

Further, nano-cutting test data of 'C6FMA-V4D4', the PFDMA-TPBO antifouling coating layer according to the comparative example 1, and the antifouling coating layers according to the embodiments 1 and 2 were shown in FIGS. 6A to 6D. FIG. 6A is a nano-cutting test result of the 'C6FMA-V4D4', FIG. 6B is a nano-cutting test result of the PFDMA-TPBO antifouling coating layer according to the comparative example 1, FIG. 6C is a nano-cutting test result of the antifouling coating layer according to the embodiment 1, and FIG. 6D is a nano-cutting test result of the antifouling coating layer according to the embodiment 2. Further, cross-sectional SM images of the 'C6FMA-V4D4', the PFDMA-TPBO antifouling coating layer according to the comparative example 1, and the antifouling coating layers according to the embodiments 1 and 2 that have undergone a nano-cutting test were shown in FIGS. 7A to 7C, in which FIG. 7A is a cross-sectional SEM image of the 'C6FMA-V4D4', FIG. 7B is a cross-sectional SEM image of the PFDMA-TPBO antifouling coating layer according to the comparative example 1 ((a) of FIG. 7B: a low-magnification SEM image and (b) of FIG. 7B: a high-magnification SEM image), FIG. 7C is a cross-sectional SEM image of the antifouling coating layer according to the embodiment 1 ((a) of FIG. 7C: a low-magnification SEM image and (b) of FIG. 7C: a high-magnification SEM image), and FIG. 7D is a cross-sectional SEM image of the antifouling coating layer according to the embodiment 2 ((a) of FIG. 7D: a low-magnification SEM image and (b) FIG. 7D: a high-magnification SEM image).

Surface energy (mM/m), shear strength $\tau_s$ (MPa), and a shear angle Ø (°) were measured under the condition of low vacuum of 0.015 Torr on the basis of the analysis results according to FIGS. 6A to 6D and FIGS. 7A to d, and were show in the following table 1.

TABLE 1

| | Surface energy (mN/m) | Shear strength $\tau_s$ (MPa) | Shear angle $^\sigma$ (°) |
|---|---|---|---|
| 'C6FMA-V4D4' | — | 73.6 ± 8.6 | 18.2 ± 7.3 |
| Comparative 1 | — | 49.73 | 9.12 |
| Embodiment 1 | 7.33 | 68.0 ± 12.4 | 16.9 ± 0.2 |
| Embodiment 2 | 8.55 | 104.5 ± 11.7 | 17.7 ± 4.5 |

Referring to FIGS. 5a to 5c, FIGS. 6A to 6C, and the table 1, it can be seen that the antifouling coating layer according to the embodiment 2 has a contact angle of 117° and shear strength of 104.5 MPa, it has excellent antifouling characteristic and durability.

Embodiment 6. Element Analysis

Element analysis was performed through EDX (Energy Dispersive X-ray Spectroscopy) at certain points in cross-sections of the PFDMA-TPBO antifouling coating layer according to the comparative example 1 and the antifouling coating layers according to the embodiments 1 and 2.

Figure 8A:
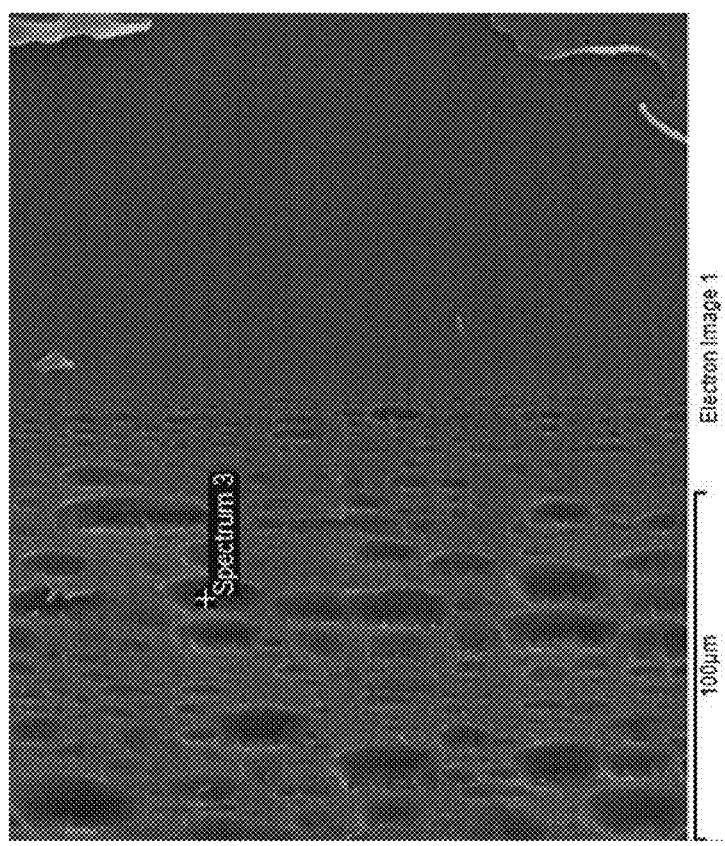
FIGS. 8A to 8C are views showing SEM images showing analysis positions when element analysis was performed on an antifouling coating layer according to an embodiment of the present disclosure.
Figure 8A:
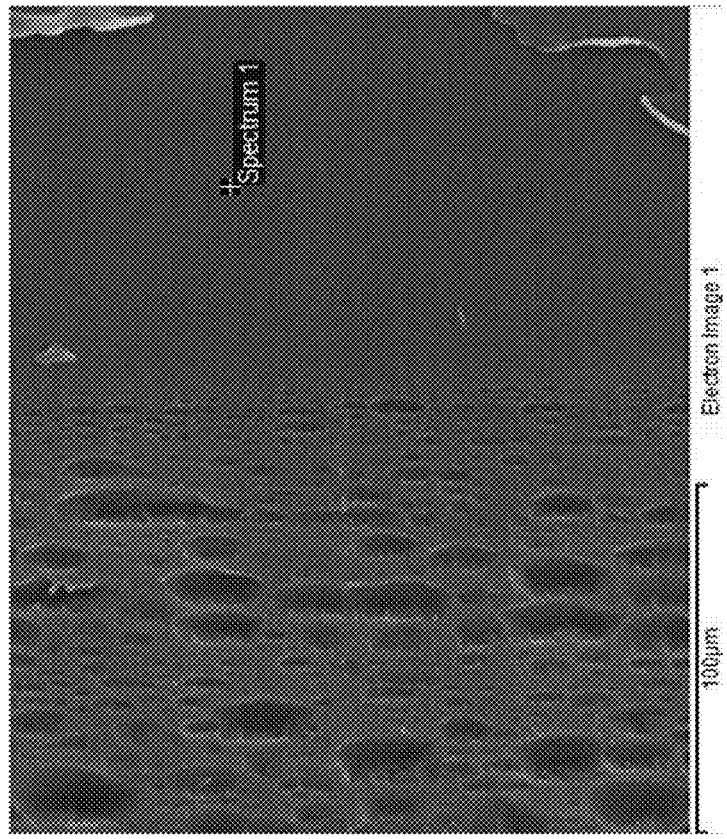
Figure 8B:
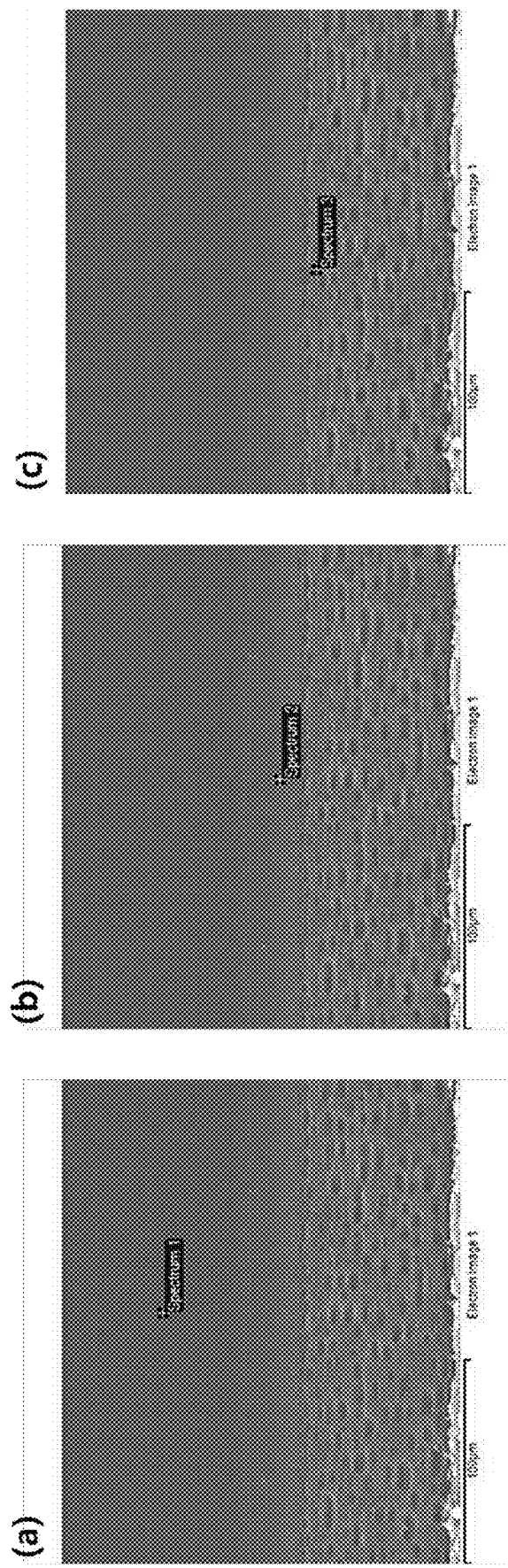
Figure 8C:
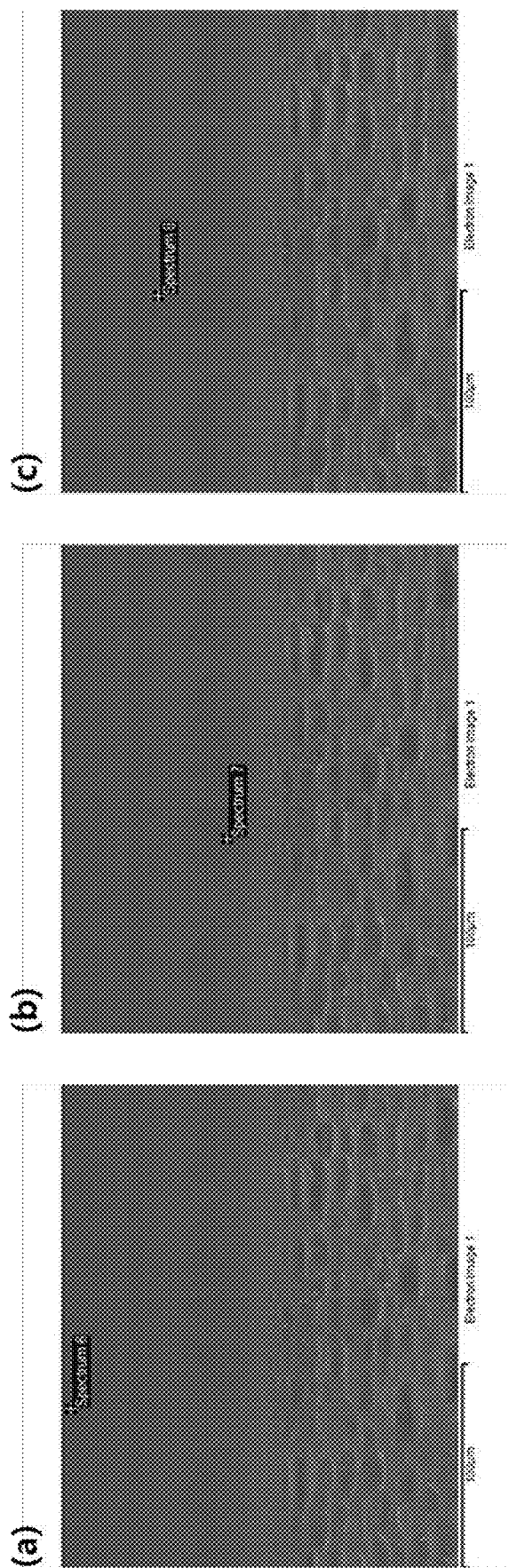

FIG. 8A is an SEM image in which a certain point, at which element analysis was performed on the PFDMA-TPBO antifouling coating layer according to the comparative example 1, is marked ('Spectrum 1' in (a) of FIG. 8A and 'Spectrum 3' in (b) of FIG. 8A), FIG. 8B is an SEM image in which a certain point, at which element analysis was performed on the antifouling coating layer according to the embodiment 1, is marked (Spectrum 1' in (a) of FIG. 8B and 'Spectrum 2' in (b) of FIG. 8B, and 'Spectrum 3' in (c)

of FIG. 8B), and FIG. 8C is an SEM image in which a certain point, at which element analysis was performed on the antifouling coating layer according to the embodiment 2, is marked (Spectrum 6' in (a) of FIG. 8C and 'Spectrum 7' in (b) of FIG. 8C, and 'Spectrum 8' in (c) of FIG. 8C).

The element analysis result of the PFDMA-TPBO antifouling coating layer according to the comparative example 1 in FIG. 8A was shown in the following Table 2 (measurement in (a) of FIG. 8A) and Table 3 (measurement in (b) of FIG. 8A).

TABLE 2

| Element | Weight (%) | Atomic (%) |
|---------|------------|------------|
| Si      | 100        | 100        |
| Total   | 100        | 100        |

TABLE 3

| Element | Weight (%) | Atomic (%) |
|---------|------------|------------|
| Si      | 100        | 100        |
| Total   | 100        | 100        |

Referring to FIG. 8A, Table 2, and Table 3, it can be seen that fluorine (F) is not found in the PFDMA-TPBO antifouling coating layer according to the comparative example 1.

The element analysis result of the antifouling coating layer according to the embodiment 1 in FIG. 8B was shown in the following Table 4 (measurement in (a) of FIG. 8B), Table 5 (measurement in (b) of FIG. 8B), and Table 6 (measurement in (c) of FIG. 8B).

TABLE 4

| Element | Weight (%) | Atomic (%) |
|---------|------------|------------|
| C       | 42.40      | 61.61      |
| F       | 12.38      | 11.38      |
| Si      | 42.64      | 26.50      |
| Sr      | 2.57       | 0.51       |
| Total   | 99.99      | 100        |

TABLE 5

| Element | Weight (%) | Atomic (%) |
|---------|------------|------------|
| C       | 28.88      | 49.12      |
| F       | 3.51       | 3.78       |
| Si      | 63.43      | 46.14      |
| Sr      | 4.17       | 0.97       |
| Total   | 99.99      | 100        |

TABLE 6

| Element | Weight (%) | Atomic (%) |
|---------|------------|------------|
| Si      | 95.49      | 98.51      |
| Sr      | 4.51       | 1.49       |
| Total   | 100        | 100        |

Referring to FIG. 8B, Table 4, and Table 5, it can be seen that there is a difference in element ratio according to analysis positions, but fluorine (F) exists. Meanwhile, referring to Table 6, it can be seen that only existence of a considerable amount of Si that is an element of a substrate is found and the measurement position of (c) of FIG. 8B corresponds to a substrate (silicon).

The element analysis result of the antifouling coating layer according to the embodiment 1 in FIG. 8C was shown in the following Table 7 (measurement in (a) of FIG. 8C), Table 8 (measurement in (b) of FIG. 8C), and Table 9 (measurement in (c) of FIG. 8C).

TABLE 7

| Element | Weight (%) | Atomic (%) |
|---------|------------|------------|
| C       | 43.18      | 62.73      |
| F       | 10.29      | 9.46       |
| Si      | 43.92      | 27.29      |
| Sr      | 2.60       | 0.52       |
| Total   | 99.99      | 100        |

TABLE 8

| Element | Weight (%) | Atomic (%) |
|---------|------------|------------|
| C       | 25.37      | 45.44      |
| Si      | 69.66      | 53.34      |
| Sr      | 4.97       | 1.22       |
| Total   | 100        | 100        |

TABLE 9

| Element | Weight (%) | Atomic (%) |
|---------|------------|------------|
| C       | 35.44      | 54.10      |
| O       | 4.52       | 5.18       |
| F       | 9.34       | 9.02       |
| Si      | 47.55      | 31.04      |
| Sr      | 3.15       | 0.66       |
| Total   | 96.85      | 99.34      |

Referring to FIG. 8C, Table 7, and Table 9, it can be seen that there is a difference in element ratio according to analysis positions, but fluorine (F) exists. Meanwhile, referring to Table 8, it can be seen that only existence of a considerable amount of Si that is an element of a substrate is found and the measurement position of (b) of FIG. 8C corresponds to a substrate (silicon).

The total values ('Weight (%)') in Table 4, Table 5, and Table 7 and the total value ('Weight (%)', 'Atomic (%)') in Table 9 are results excluding the measurement value of platinum (Pt) used for preprocessing in the EDX analysis process.

Experiment Example 7. Application to Copper Substrate

Figure 9A:
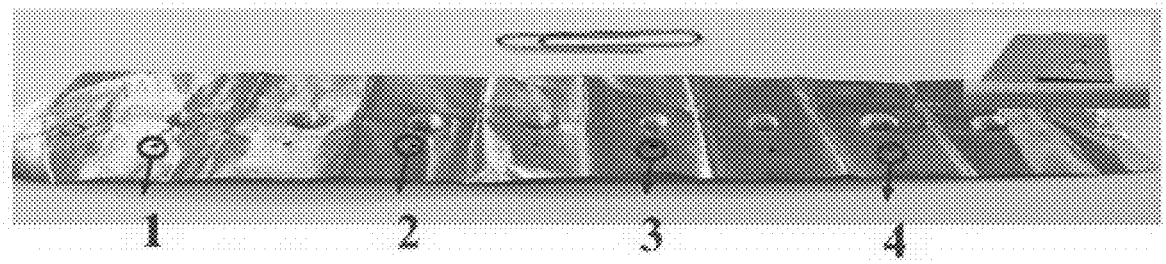
FIG. 9A is a view showing an image of a copper (Cu) substrate that is a target of an antifouling coating layer according to an embodiment of the present disclosure.

This was performed in the same way as the embodiment 2 and an antifouling coating layer was manufactured through an iCVD process by applying a 4-time folded copper (Cu) substrate, as in the insert of FIG. 9A, as a substrate in a chamber.

Figure 9B:
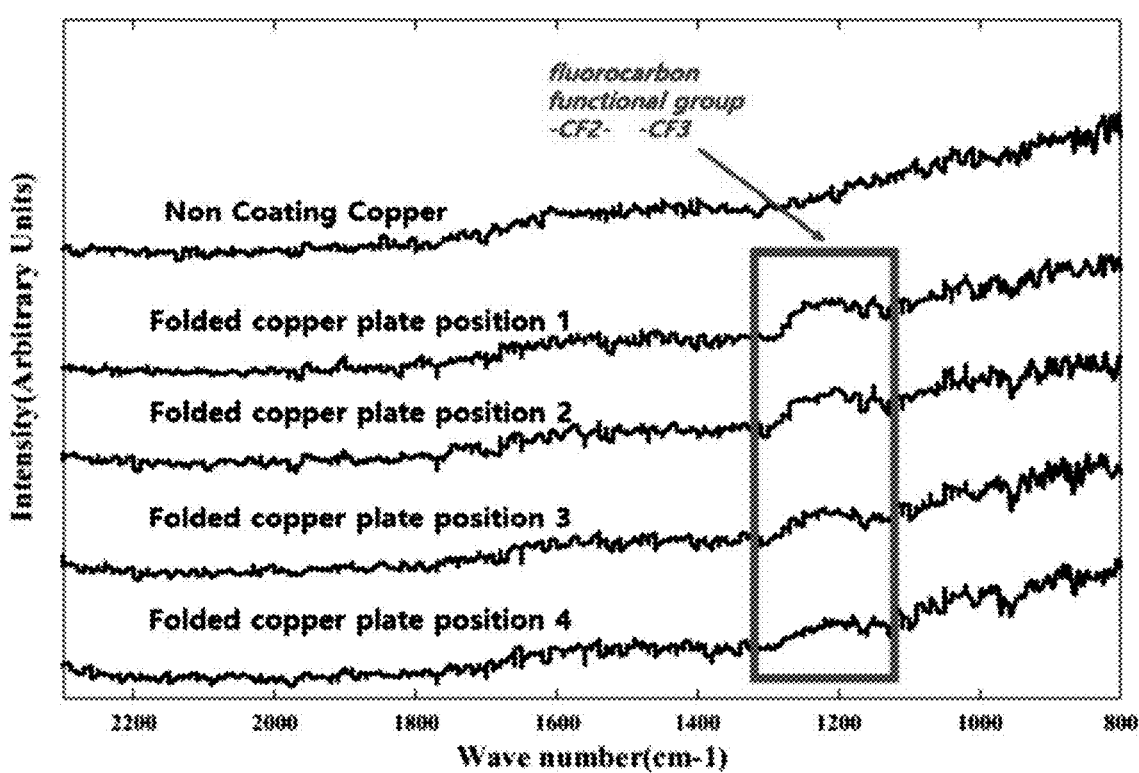
FIG. 9B is a view showing an FT-IR analysis result performed after forming an antifouling coating layer on the copper (Cu) substrate of FIG. 9A.

After the antifouling coating layer is formed, the 4-time folded copper (Cu) was unfolded, as in FIG. 9A, and then FT-IR analysis was performed at each point (deposition point), and the FR-IR analysis result was shown in FIG. 9B.

Referring to FIG. 9B, it can be seen that fluorocarbon ('—CF$_2$', '—CF$_3$') are observed at the same points ('Folded copper plate position 1', 'Folded copper plate position 2', 'Folded copper plate position 3', 'Folded copper plate position 4') even in the folded state, and it can be seen that an antifouling coating layer was correspondingly formed.

Although embodiments of the present disclosure were described above in detail, the spirit of the present disclosure is not limited thereto and the present disclosure may be changed and modified in various ways on the basis of the basic concept without departing from the scope of the present disclosure described in the following claims.

What is claimed is:

1. A method of manufacturing an antifouling coating layer, the method comprising depositing a fluorine-based monomer, a crosslinking agent, and an initiator on a substrate by putting them into an iCVD chamber,
   wherein the fluorine-based monomer is one or two selected from a group of C7FMA and C8FMA,
   wherein a flow rate ratio of the fluorine-based monomer, the crosslinking agent, and the initiator that are put into an iCVD chamber is fluorine-based monomer:crosslinking agent:initiator=2:0.7-1.5:1,
   wherein the crosslinking agent is GMA (glycidyl methacrylate),
   wherein the initiator is TBPO (tert-butyl peroxide),
   wherein the fluorine-based monomer is heated at 60 to 90° C.,
   wherein the crosslinking agent is heated at 30 to 45° C.,
   wherein a flow rate of the fluorine-based monomer is 8.4 to 10.4 (standard cubic centimeter per minute) sccm,
   wherein a flow rate of the crosslinking agent is 3.5 to 8 sccm,
   wherein a flow rate of the initiator is 4.6 to 5.4 sccm, and
   wherein the substrate is an ITO (Indium Tin Oxide) transparent electrode.

2. A method of manufacturing an antifouling coating layer, the method comprising depositing a fluorine-based monomer, a crosslinking agent, and an initiator on a substrate by putting them into an iCVD chamber,
   wherein the fluorine-based monomer is one or two selected from a group of C7FMA and C8FMA,
   wherein a flow rate ratio of the fluorine-based monomer, the crosslinking agent, and the initiator that are put into an iCVD chamber is fluorine-based monomer:crosslinking agent:initiator=2:0.7-1.5:1,
   wherein the crosslinking agent is GMA (glycidyl methacrylate),
   wherein the initiator is TBPO (tert-butyl peroxide),
   wherein the fluorine-based monomer is heated at 60 to 90° C.,
   wherein the crosslinking agent is heated at 30 to 45° C.,
   wherein a flow rate of the fluorine-based monomer is 8.4 to 10.4 (standard cubic centimeter per minute) sccm,
   wherein a flow rate of the crosslinking agent is 3.5 to 8 sccm,
   wherein a flow rate of the initiator is 4.6 to 5.4 sccm, and
   wherein the substrate is a silver nano wire (AgNW) transparent electrode.

* * * * *